(12) United States Patent
Ho et al.

(10) Patent No.: US 7,362,545 B2
(45) Date of Patent: Apr. 22, 2008

(54) HEAD STACK ASSEMBLY AND MANUFACTURING METHOD THEREOF, AND DISK DRIVE UNIT USING THE SAME

(75) Inventors: YiuSing Ho, HongKong (CN); GuoHong Lu, DongGuan (CN); CanHua Chen, DongGuan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 536 days.

(21) Appl. No.: 10/922,993

(22) Filed: Aug. 23, 2004

(65) Prior Publication Data
US 2006/0039087 A1    Feb. 23, 2006

(51) Int. Cl.
*G11B 21/08* (2006.01)
(52) U.S. Cl. .................................................. 360/264.2
(58) Field of Classification Search ............. 360/264.2
See application file for complete search history.

(56) References Cited

U.S. PATENT DOCUMENTS

| 5,095,396 | A  | * | 3/1992  | Putnam et al. ........... 360/264.2 |
|-----------|----|---|---------|------------------------------------|
| 5,680,277 | A  | * | 10/1997 | Bonn et al. .............. 360/264.2 |
| 5,995,321 | A  | * | 11/1999 | Ishida ..................... 360/97.01 |
| 6,166,888 | A  | * | 12/2000 | Tsuda et al. ............. 360/264.2 |
| 6,721,135 | B2 | * | 4/2004  | Hong et al. .............. 360/264.2 |
| 6,992,864 | B2 | * | 1/2006  | Kaneko et al. .......... 360/264.2 |
| 7,119,993 | B2 | * | 10/2006 | Zuo et al. ................ 360/264.2 |
| 2004/0228039 | A1 | * | 11/2004 | Wu et al. ................ 360/264.2 |
| 2006/0146447 | A1 | * | 7/2006  | Ho et al. ................. 360/264.2 |
| 2007/0014051 | A1 | * | 1/2007  | Wu et al. ................ 360/264.2 |

* cited by examiner

*Primary Examiner*—Allen Cao
(74) *Attorney, Agent, or Firm*—Oliff & Berridge, PLC

(57) ABSTRACT

Connecting a head gimbal assembly with a controlling circuit, including the steps of facing connecting terminals of the head gimbal assembly and the connecting terminal of the controlling circuit to contact with each other and fastening the head gimbal assembly with the controlling circuit to maintain a touch connection of the terminals thereof.

19 Claims, 10 Drawing Sheets

HEAD STACK ASSEMBLY AND MANUFACTURING METHOD THEREOF, AND DISK DRIVE UNIT USING THE SAME

FIELD OF THE INVENTION

The present invention relates to head stack assemblies and manufacturing methods thereof, and more particularly to a method of connecting HGA (head gimbal assembly) with controlling circuit thereof.

BACKGROUND OF THE INVENTION

Disk drives are information storage devices that use magnetic media to store data. Referring to FIG. 1, a typical disk drive in related art comprises a head stack assembly (HSA) 904 with slider(s) 903 thereon, a magnetic disk 901 mounted on a spindle motor 902 to spin the magnetic disk 901, and a housing 907 to enclose the above-mentioned components. The slider(s) 903 is including in sensor to read data from or write data to the surface of the magnetic disk 901 by surfacing over it, which is positioned radially by a voice coil 906 embedded (e.g. by epoxy potting or overmolding) in a fantail spacer 908 of the HSA 904. Generally, a voice coil motor (VCM) 914 is used to drive the voice coil 906.

Referring to FIGS. 2(a) and 2(b), the HSA 904 comprises four head gimbal assemblies 971, 973, 975 and 977. In the related art, the HSA 904 further comprises a spacer 81' interposed between the head gimbal assembly (HGA) 971 and the HGA 973, a fantail spacer 831' sandwiched between the HGA 975 and the HGA 977, and a plurality of securing means to couple the four HGAs 971, 973, 975, 977 with the spacer 81' and the fantail spacer 831' together. A flexible printed circuit (FPC) 9' is aligned with the fantail spacer 831' by a FPC assembly 835' formed at an end of the FPC 9' to electrically connect with the four head gimbal assemblies 971, 973, 975, 977. The FPC assembly 835' has a plurality of solder pads 999 thereon. Referring to FIG. 2(c), the fantail spacer 831' has a mounting block 839' with an opening 838' formed therein used for aligning with the FPC assembly 835'. In the related art, the plurality of securing means comprises a bearing 70', a washer 76' and a nut 78'. Each of the four head gimbal assemblies 971, 973, 975, 977 forms a big hole (not labeled) therein and so does the spacer 81' and the fantail spacer 831'. These big holes are provided to permit the bearing 70' extend therethrough so as to combine these parts together with the help of the washer 76' and the nut 78'.

In the related art, also referring to FIGS. 2(a) and 2(b), each of the four head gimbal assemblies 971, 973, 975, 977 has a suspension flexure cable (not labeled) running from the slider 903 to a trace terminal of the suspension flexure cable (the trace terminals of the HGAs 971, 973, 975, 977 are labeled as "961", "963", "965", "967", respectively). Each of the trace terminals 961, 963, 965, 967 forms a plurality of terminal pads 99 corresponding to the solder pads 999 and each of the terminal pads 99 is shaped as a through-hole. The layout of the terminal pads 99 on each of the trace terminals 961, 963, 965, 967 is same as the other.

Referring to FIG. 2(a), when the HSA 904 is assembled, the trace terminals 961, 963, 965, 967 are positioned on the FPC assembly 835' and a slot 8 is defined between two adjacent trace terminals of the trace terminals 961, 963, 965, 967. In the related art, the HGAs 971, 973, 975, 977 are electrically connected with the FPC 9' by solder bonding the terminal pads 99 of the trace terminals 961, 963, 965, 967 with the solder pads 999 of the FPC assembly 835'.

However, the traditional method uses solder bonding process for connecting HGA with FPC. It results in occurrence of component contamination. To avoid component contamination, it is necessary to clean the HSA after solder bonding process. Such cleaning process is also rather difficult and costly. More seriously, the solder bonding process might cause a damage of the surrounding electrical components and/or disk media. In addition, the HSA assembly line and the hard disk drive (HDD) assembly line cannot be integrated together because the HSA must be cleaned before it is mounted in the housing of the disk drive. Furthermore, there is a case to separate the HGA with the FPC for rework (repairing or replacing) when there is something wrong with the HGA or the FPC. However, separating the HGA with the FPC is also troublesome because the solders bonded therebetween must be deleted. Accordingly, reworking the HSA is rather time-consuming and costly. Finally, because the terminal pads on each of the trace terminals has the same layout, it makes the electrical traces of the FPC, which connect with the terminal pads, rather jam-packed and accordingly the design and fabrication of the IC module of the FPC becomes difficult.

It is therefore desirable to provide a HSA and manufacturing method thereof, a disk drive unit using the HSA to solve the above-mentioned problems.

SUMMARY OF THE INVENTION

A main feature of the present invention is to provide a method of connecting head gimbal assemblies (HGAs) with its control circuit which is convenient for rework of HSA.

Another feature of the present invention is to provide a HSA which is easily assembled and reworked, a manufacturing method thereof and a disk drive unit using the HSA.

To achieve the above-mentioned features, a method of connecting head gimbal assembly with controlling circuit thereof, comprises the steps of: facing connecting terminals of at least one head gimbal assemblies and connecting terminal of their controlling circuit to contact with each other; and fastening said at least one head gimbal assembly with their controlling circuit to maintain a touch connection of said connecting terminals thereof. In the present invention, the method further comprises a step of disposing a conductive medium between said connecting terminals of said at least one head gimbal assemblies and said connecting terminal of their controlling circuit.

In an embodiment of the present invention, the method further comprises a step of forming a plurality of terminal pads on each of said connecting terminals of said at least one head gimbal assemblies and their controlling circuit. In the present invention, the conductive medium is disposed between the terminal pads on said connecting terminals of said at least one head gimbal assemblies and the terminal pads on said connecting terminal of their controlling circuit.

A head stack assembly of the present invention comprises at least one head gimbal assemblies and a controlling circuit for controlling the at least one head gimbal assemblies. Each of the at least one head gimbal assemblies has a connecting terminal and said controlling circuit has a connecting terminal as well. The connecting terminals of at least one head gimbal assemblies touch connects with the connecting terminal of said controlling circuit by fastening said at least one head gimbal assemblies with said controlling circuit.

In the present invention, a conductive medium is disposed between said connecting terminals of said at least one head gimbal assemblies and the connecting terminals of said controlling circuit. As an embodiment, said conductive medium is gold ball or solder ball. A plurality of terminal pads are formed on each of said connecting terminals of said at least one head gimbal assemblies and said controlling circuit. The conductive medium is disposed between the terminal pads on said connecting terminals of said at least one head gimbal assemblies and the terminal pads on said connecting terminal of said controlling circuit. In an embodiment of the present invention, the terminal pads on each pair of connecting terminals of said head gimbal assemblies are symmetrically distributed along a contacting surface of the pair of connecting terminals.

A method of forming a head stack assembly, comprises the steps of: forming at least one head gimbal assemblies; wherein forming each of the head gimbal assemblies comprises forming a connecting terminal thereon; forming a controlling circuit having a connecting terminal, which is used for controlling the at least one head gimbal assemblies; facing the connecting terminals of at least one head gimbal assemblies and the connecting terminal of said controlling circuit to contact with each other; and fastening said at least one head gimbal assembly with said controlling circuit to maintain a touch connection of said connecting terminals thereof. In the present invention, the method further comprises a step of disposing a conductive medium between said connecting terminals of said at least one head gimbal assemblies and said controlling circuit.

A disk drive unit comprises a housing; a disk stack comprising at least one disks; a spindle motor being attached to the housing for rotating the disk stack; and a HSA. The HSA comprises at least one head gimbal assemblies and a controlling circuit for controlling the at least one HGAs. Each of the at least one HGAs has a connecting terminal; said controlling circuit having a connecting terminal as well. The connecting terminals of at least one head gimbal assemblies and the connecting terminal of said controlling circuit touch connecting with each other by fastening said at least one head gimbal assembly with said controlling circuit. In the present invention, a conductive medium is disposed between said connecting terminals of said at least one head gimbal assemblies and said connecting terminal of said controlling circuit.

Comparing with the prior art, a method of connecting HGA with a FPC of a HSA of the present invention solves the problems of component contamination, component damage, and cleaning because solder is not used in connection process. In addition, because the HSA of the present invention do not need being cleaned before it is mounted in the base plate of the disk drive, so the HSA assembly line and the disk drive assembly line can be integrated together, accordingly it improves the efficiency of manufacturing the disk drive units. Furthermore, when there is something wrong with the HGA or the FPC, it does not need separate the HGA with the FPC for repairing or replacing (that is, making rework of the HSA more easily). Finally, because the terminal pads on each pair of trace terminals are formed symmetrically along the contacting surface thereof when they are positioned together, it makes the distribution of the electrical traces of the FPC more reasonable, and accordingly the design and fabrication of the IC module of the FPC becomes easy.

Other objects, advantages and novel features of the invention will become more apparent from the following detailed description of a preferred embodiment thereof when taken in conjunction with the accompanying drawings, wherein:

DESCRIPTION OF THE DRAWINGS

FIG. 2(*b*) is an exploded, perspective view of the HSA in FIG. 2(*a*);

FIG. 2(*c*) is a perspective view of a fantail spacer of the HSA in FIG. 2(*b*);

DETAILED DESCRIPTION OF THE INVENTION

Figure 1:
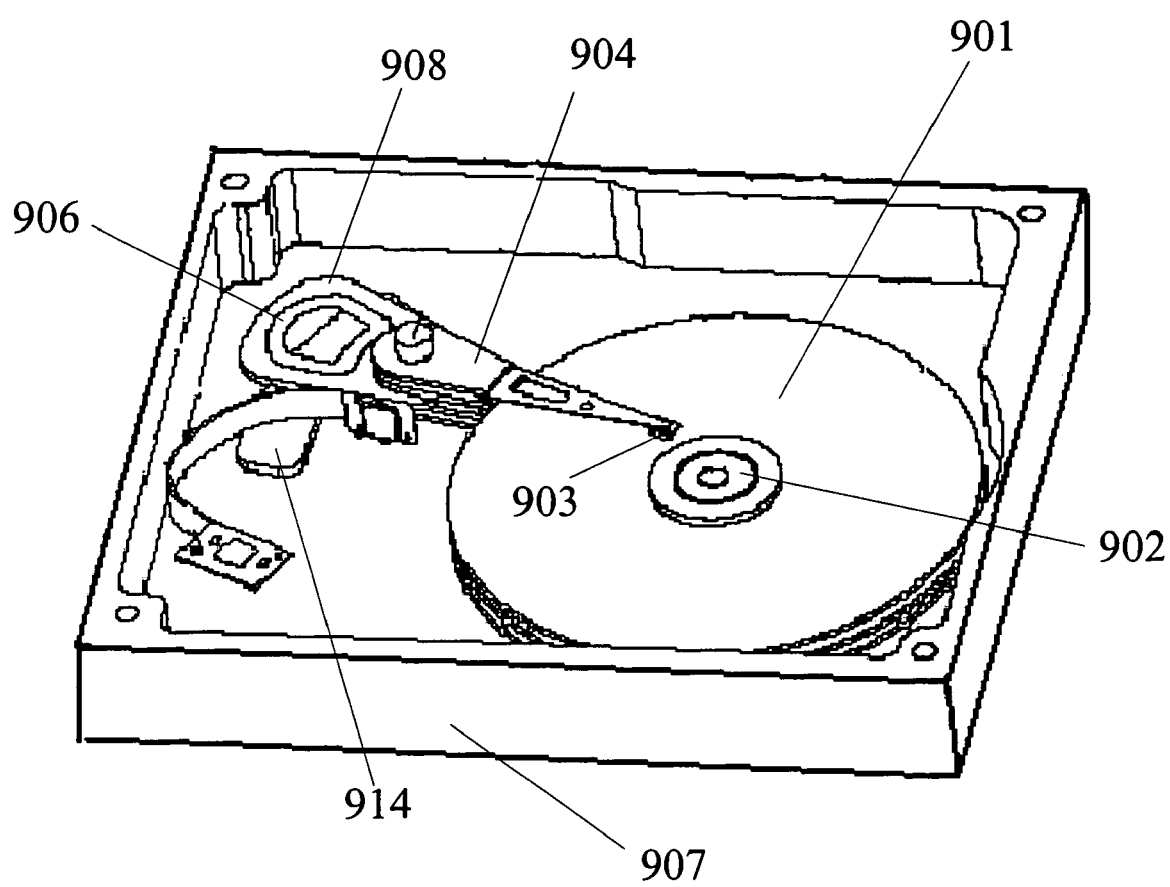
FIG. 1 is a perspective view of a traditional disk drive.
Figure 2A:
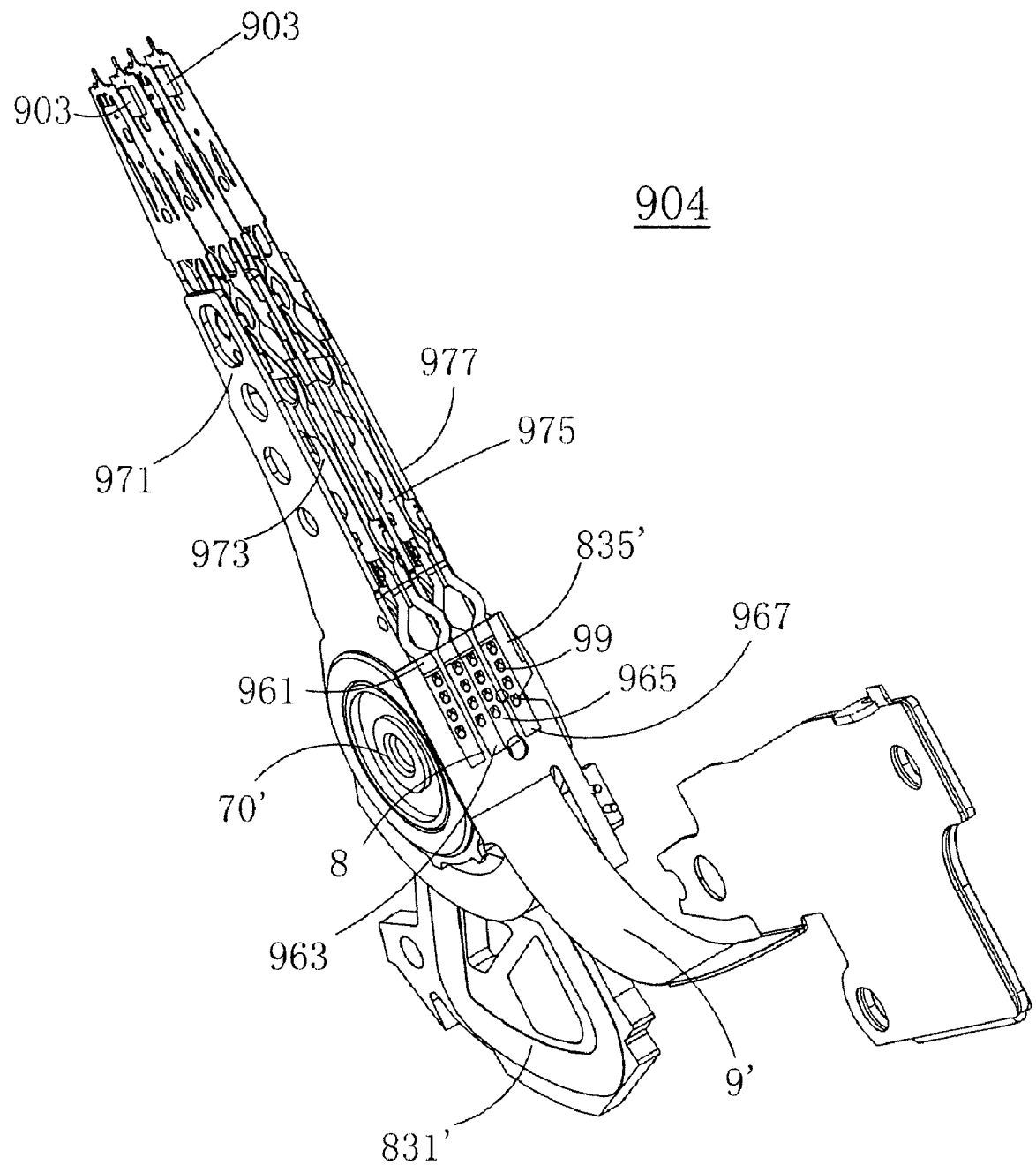
FIG. 2(*a*) is a perspective view of a traditional assembled head stack assembly (HSA)
Figure 2B:
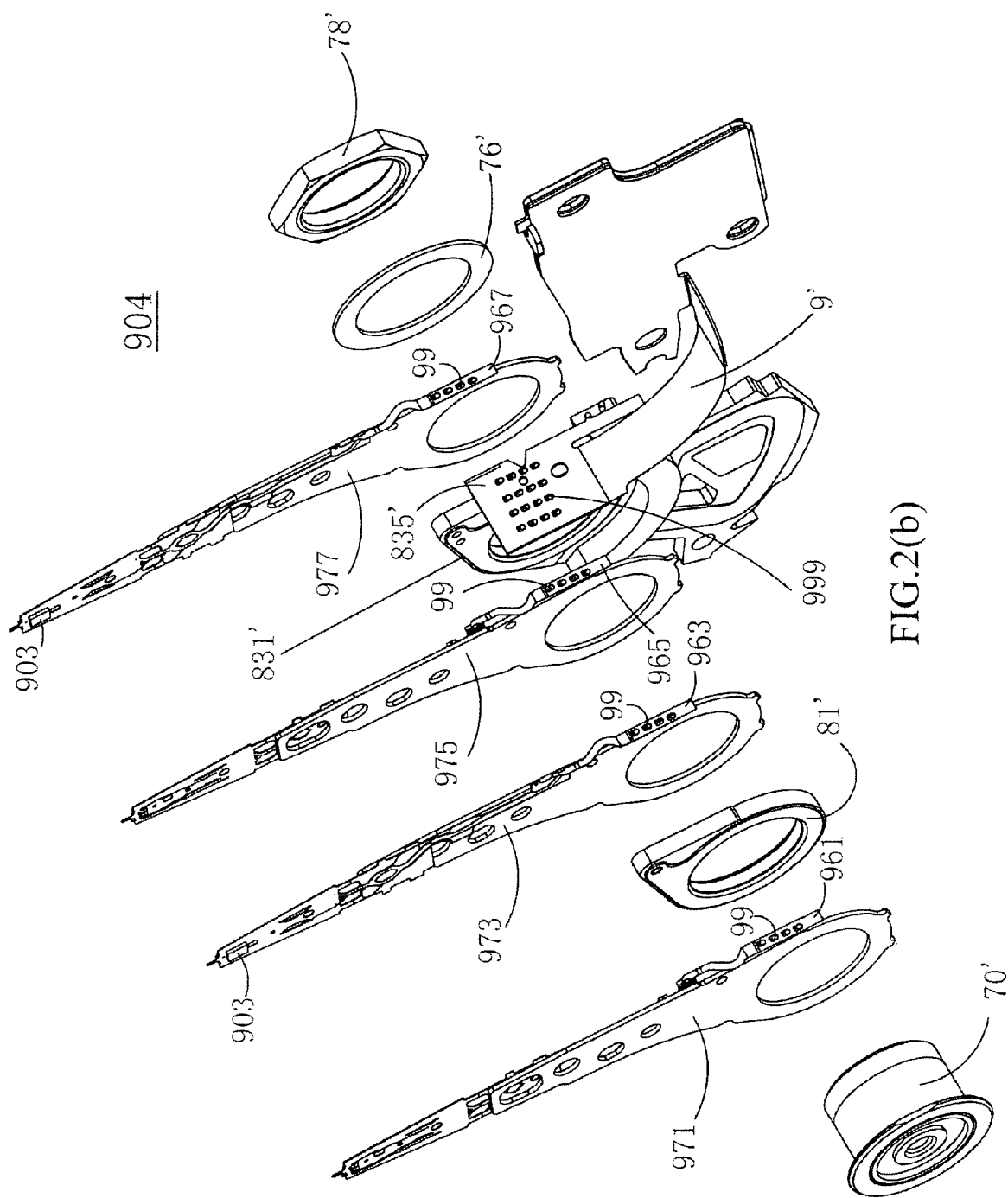
Figure 2C:
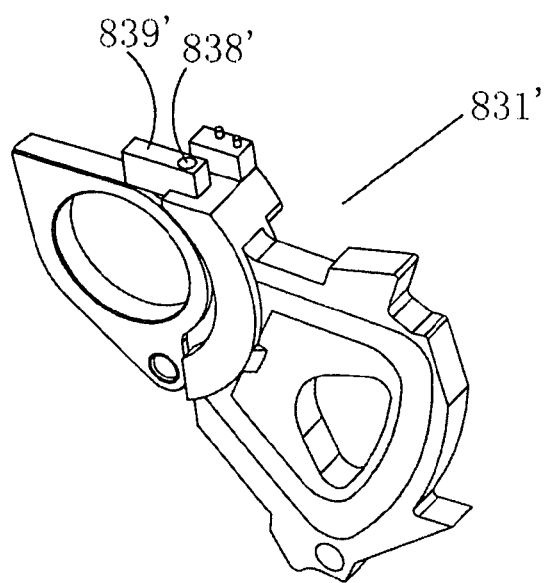
Figure 3:
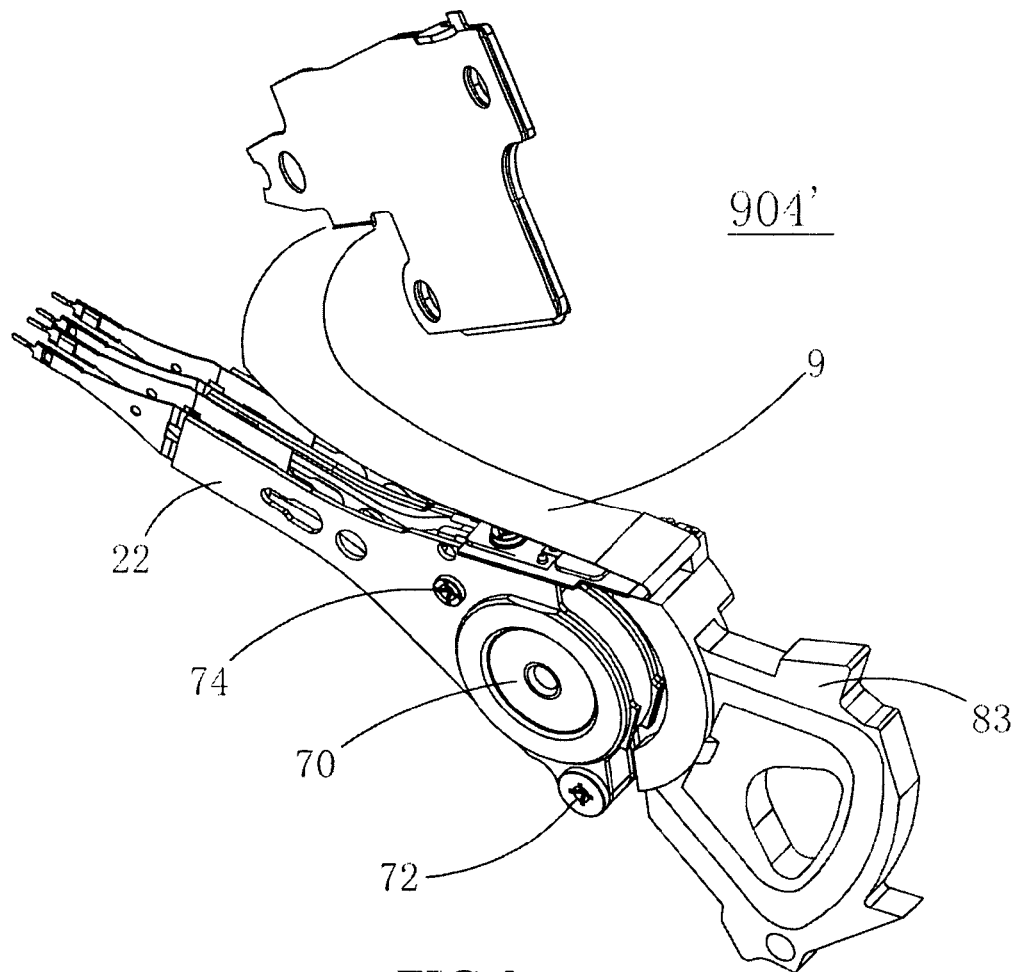
FIG. 3 is a perspective view of an assembled HSA according to an embodiment of the present invention.
Figure 4:
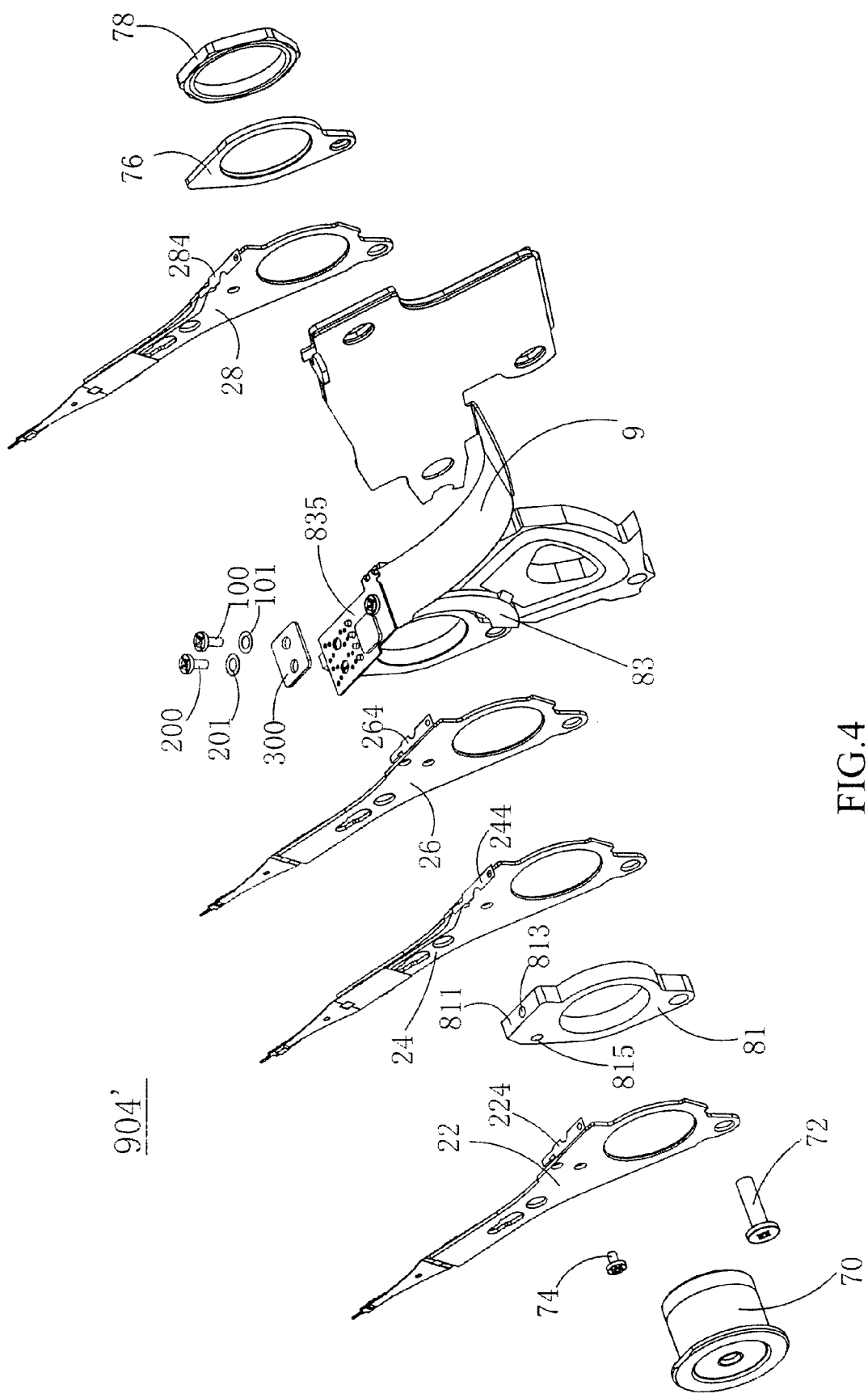
FIG. 4 is an exploded, perspective view of the HSA in FIG. 3.

Referring now to the drawings in detail, FIGS. 3 and 4 show a head stack assembly (HSA) of a disk drive unit according to an embodiment of the present invention. The HSA 904' comprises four HGAs 22, 24, 26, 28 and a plurality of securing means to couple the four HGAs 22, 24, 26, 28 together. In the present invention, the HSA 904' further comprises a spacer 81 interposed between the head gimbal assembly (HGA) 22 and the HGA 24, a fantail spacer assembly 83 sandwiched between the HGA 26 and the HGA 28, and a plurality of locking members to lock the four head gimbal assemblies 22, 24, 26, 28 with the fantail spacer assembly 83 on its lateral side. A flexible printed circuit (FPC) 9 is aligned with the fantail spacer assembly 83 at an end thereof to electrically connect with the four HGAs 22, 24, 26 and 28. In an embodiment of the present invention, the plurality of securing means comprises a bearing 70, two screws 72, 74, a washer 76 and a nut 26, each of the four HGAs 22, 24, 26, 28 forms three holes (not labeled) therein, the spacer 81 and the fantail spacer assembly 83 also form corresponding holes (not labeled) therein, these holes are provided to permit the bearing 70 and the corresponding screws 72, 74 extend therethrough so as to combine these parts together with the help of the washer 76 and the nut 78. Additionally, the plurality of locking members comprise two screws 100, 200, two washers 101, 102, and a mount plate 300.

Figure 10:
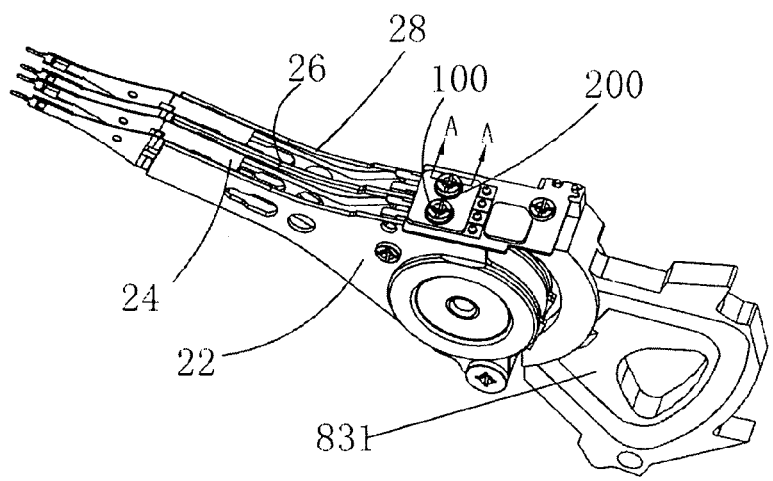
FIG. 10 is a perspective view to show the trace terminals of FIG. 8 being fastened with the FPC assembly.
Figure 11:
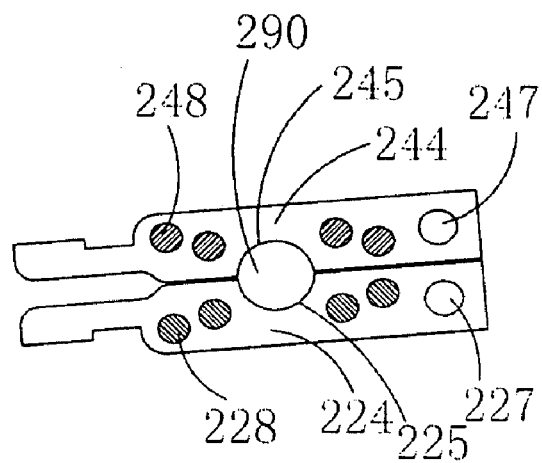
FIG. 11 is an enlarged, partial view of two assembled trace terminals of the HGAs.

With reference to FIG. 4, each of the four head gimbal assemblies 22, 24, 26, 28 comprises a suspension flexure cable which terminates with a trace terminal, i.e. the HGA 22 has a trace terminal 224, the HGA 24 has a trace terminal 244, the HGA 26 has a trace terminal 264, and the HGA 28 has a trace terminal 284. In the present invention, the trace terminals 224 and 244 are folded face to face from the HGAs 22 and 24, respectively; similarly, the trace terminals 264 and 284 are folded face to face from the HGAs 26 and 28, respectively. A detail view of the assembled trace terminals 224, 244 is shown on FIG. 11. FIG. 11 shows the trace terminal 224 and the trace terminal 244 being positioned together. The trace terminal 224 is provided with a plurality of terminal pads 228 and a screw hole 227 formed on an end thereof. In addition, the trace terminal 224 also forms a fixing hole 225 in a lateral side thereof. Similarly, the trace terminal 244 is provided with a plurality of terminal pads 248, a screw hole 247 and a fixing hole 245. When the two trace terminals 224, 244 are positioned together, the terminal pads 228 and the terminal pads 248 are symmetrically distributed along the contacting surface of the two trace terminals 224, 244, simultaneously, the two fixing holes 225 and 245 mutually define an assembly hole 290 to let the screw 100 extend therethrough (best see FIG. 10). In the present invention, an assembly and structures of two trace terminals 264 and 284 are similar with the trace terminals 224 and 244, and a detail description of such assembly and structures is omitted herefrom.

Figure 5:
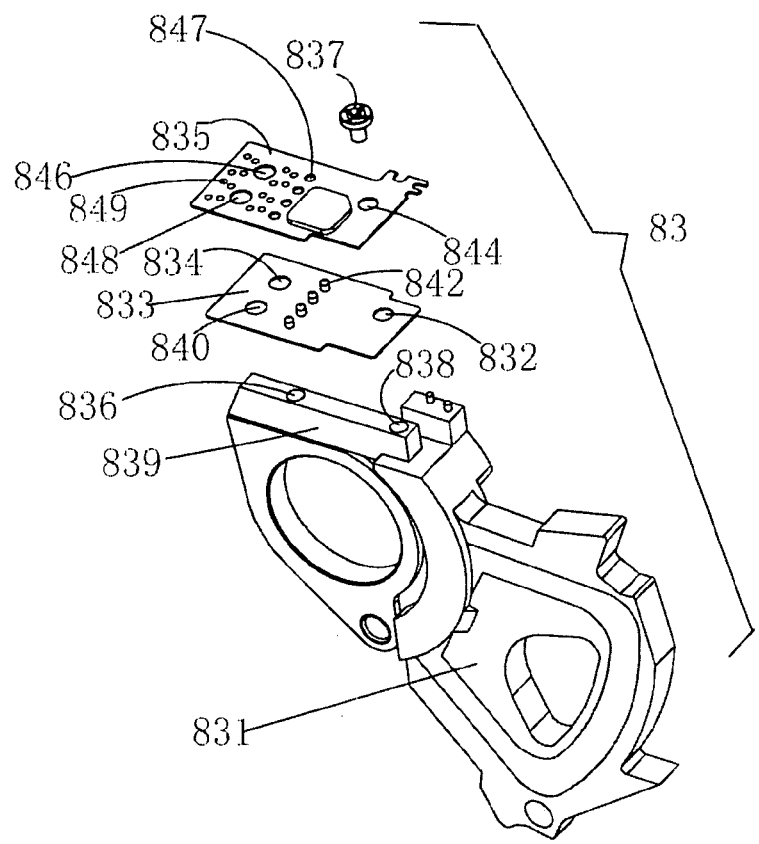
FIG. 5 is an exploded, perspective view of an fantail spacer assembly of the HSA in FIG. 4.
Figure 6:
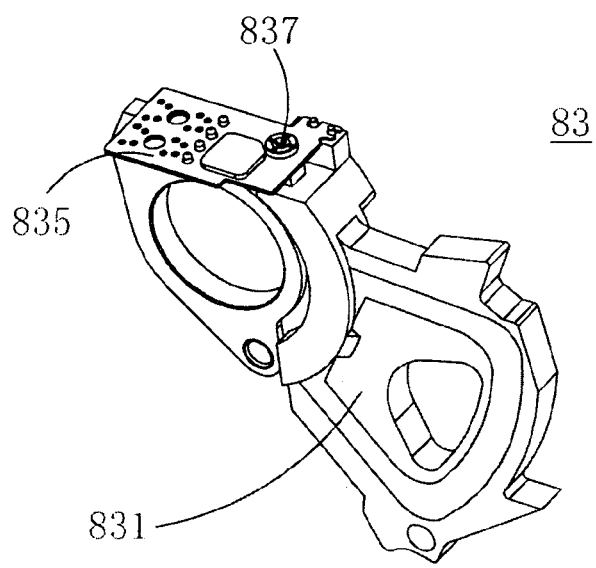
FIG. 6 is a perspective view of the assembled fantail spacer assembly of FIG. 5.
Figure 12:
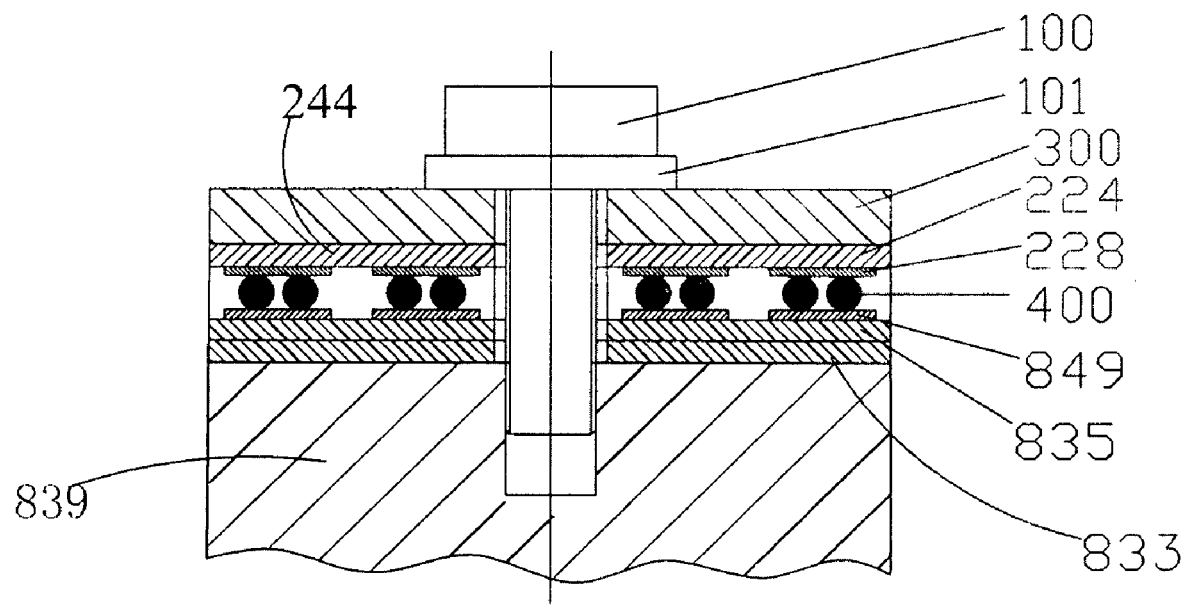
FIG. 12 is a cross-sectional view of the HSA in FIG. 10 taken along line A-A.

Referring to FIGS. 5 and 6, the fantail spacer assembly 83 comprises a fantail spacer 831, a flexible printed circuit (FPC) assembly 835, a FPC stiffener 833 positioned between the fantail spacer 831 and the FPC assembly 835, and a screw 837 to secure the fantail spacer 831, the FPC assembly 835 and the FPC stiffener 833 together. The fantail spacer 831 forms a protrusion 839 with two taped holes 836 and 838 therein to support the FPC assembly 835 and the FPC stiffener 833 on a lateral side thereof. In addition, the FPC stiffener 833 forms three mounting holes 832, 834 and 840 therein and four alignment pins 842 overmolded thereon. The FPC assembly 835 has three mounting holes 844, 846 and 848 corresponding to the three mounting holes 832, 834 and 840 and four alignment holes 847 to let the four alignment pins 842 extend therethrough. Additionally, a plurality of FPC pads 849 shaped as blind holes are also formed on the FPC assembly 835 corresponding to the terminal pads of the trace terminals 224, 244, 264, 284 (wherein the terminal pads on the trace terminals 224, 244 are labeled as "228", "248", see FIG. 12).

Referring to FIG. 4, the spacer 81 has a protrusion 811 formed thereon to support the FPC assembly 835 and the FPC stiffener 833. A taped hole 813 is formed on the protrusion 811 corresponding to the mounting hole 840 of the FPC stiffener 833 and the mounting hole 848 of the FPC assembly 835. In an embodiment of the present invention, the spacer 81 also has an alignment aperture 815 therein for precisely assembly of the HSA 904'.

During assembly, referring to FIGS. 5 and 6, firstly, the FPC stiffener 833 is aligned with the FPC assembly 835, accordingly, the four alignment pins 842 of the FPC stiffener 833 extend through the four alignment holes 847 of the FPC assembly 835 and simultaneously the three mounting holes 844, 846 and 848 of the FPC assembly 835 are aligned with the three mounting holes 832, 834 and 840 of the FPC stiffener 833. Then, the FPC stiffener 833 and the FPC assembly 835 are put on the fantail spacer 831 with the taped hole 838, the mounting hole 832 and the mounting hole 844 being aligned, and subsequently the screw 837 extends through the mounting hole 832 and the mounting hole 844 and engages with the taped hole 838. Thus, a fantail spacer assembly 83 is formed, as shown in FIG. 6.

Figure 7:
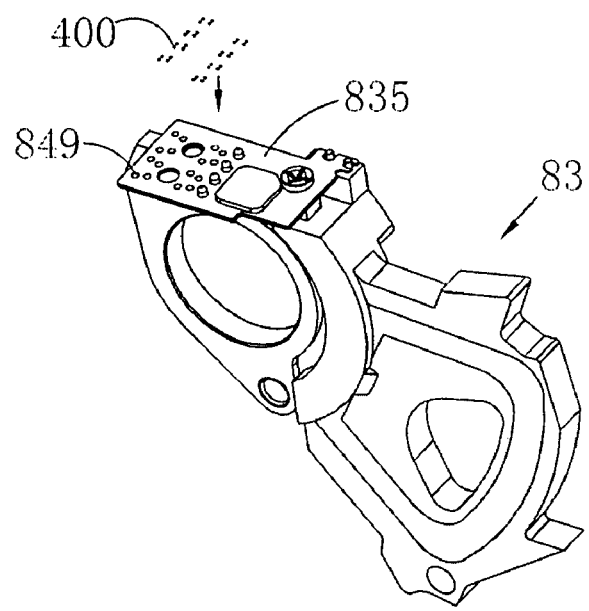
FIG. 7 shows a process of putting a plurality of metal balls onto corresponding FPC pads of a FPC assembly.
Figure 8:
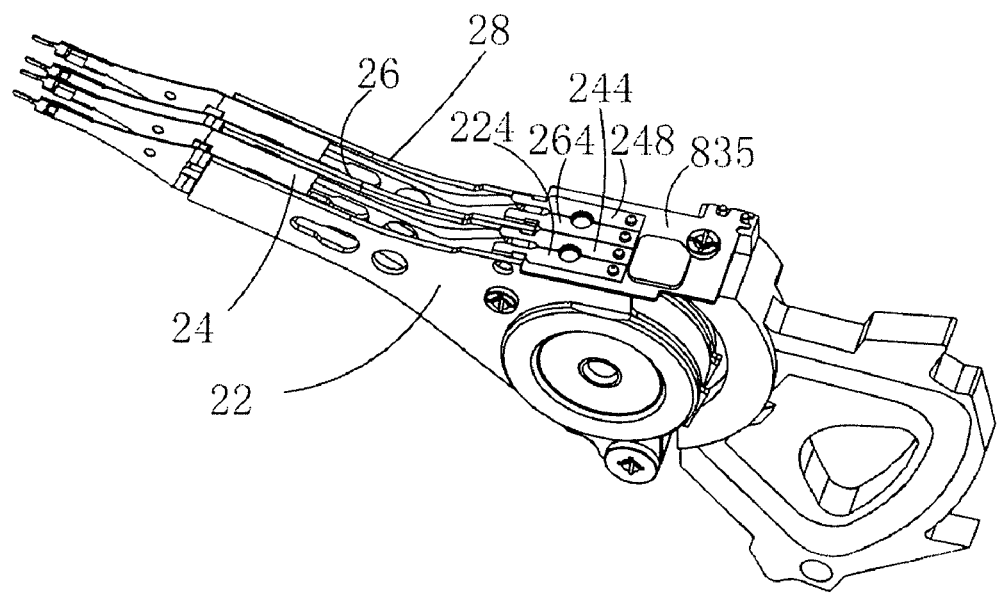
FIG. 8 is a perspective view to show trace terminals of HGAs being positioned on the FPC assembly of the HSA in FIG. 3.
Figure 9:
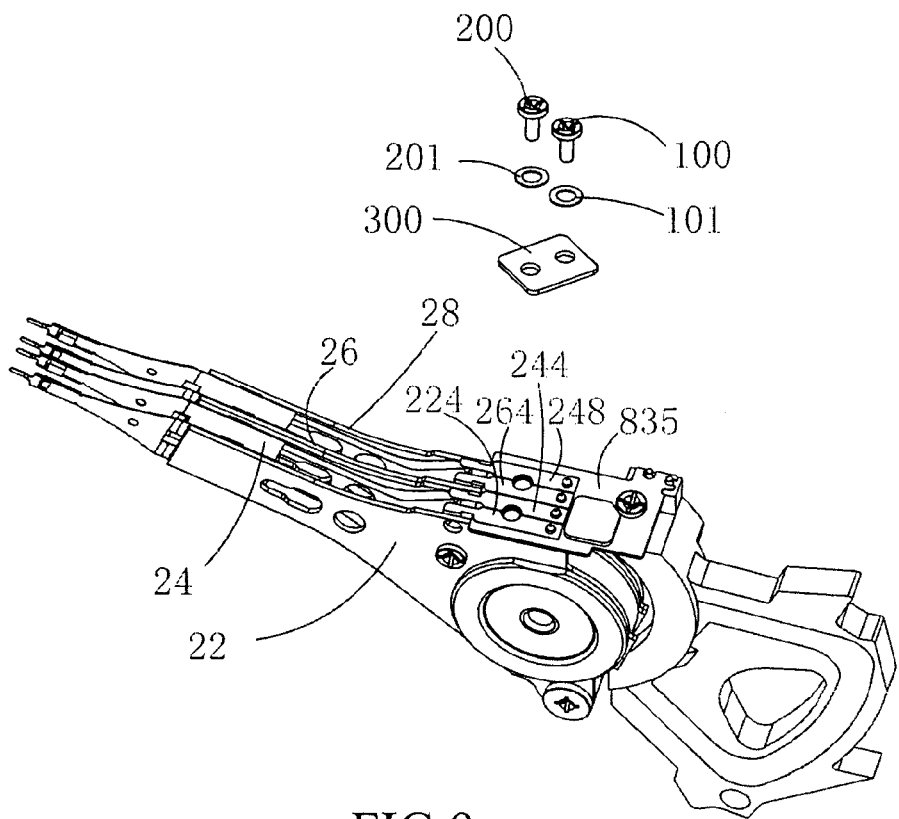
FIG. 9 shows a process of fastening the trace terminals of FIG. 8 with the FPC assembly.

Subsequently, referring to FIG. 7, a plurality of metal balls 400, such as gold balls, or solder balls, are bonded on the FPC pads 849 of the FPC assembly 835. Then, referring to FIG. 8, the four head gimbal assemblies 22, 24, 26, 28, the spacer 81 and the fantail spacer assembly 83 are assemblied together so as to put the trace terminals 224, 244, 264, and 284 on the FPC assembly 835, and accordingly the metal balls 400 are sandwiched between the FPC pads 849 and the terminal pads of the trace terminals 224, 244, 264, 284 (wherein the terminal pads on the trace terminals 224, 244 are labeled as "228", "248", see FIG. 11). Finally, with reference to FIGS. 9 and 10, a plurality of locking members, i.e. two screws 100, 200, two washers 101, 102 and a mount plate 300, are used to secure the FPC pads 849 with the terminal pads firmly and thus a superior electrical connection between the HGAs 22, 24, 26, 28 and the FPC 9 is attained, see FIG. 12.

Figure 13:
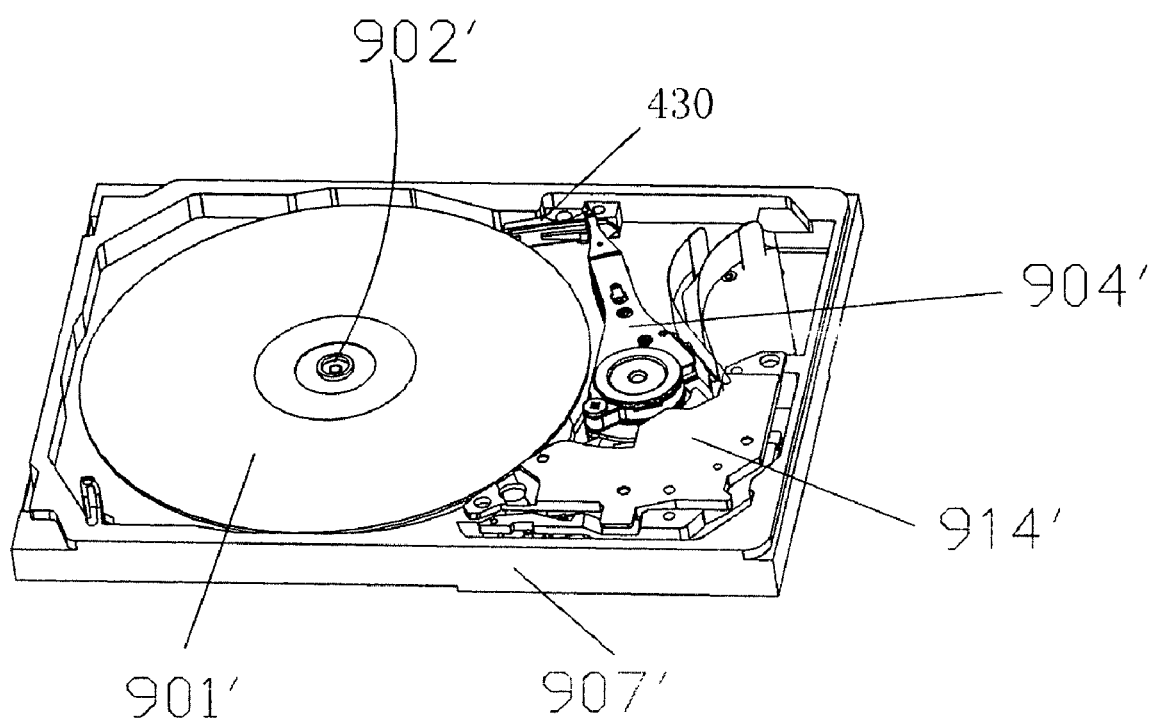
FIG. 13 shows a disk drive unit with the HSA of FIG. 3 mounted therein.

Referring to FIG. 13, After assembly of the HSA 904', the HSA 904' is put into and secured with a base plate 907', and other essential parts, such as disk 901', ramp 430, spindle motor 902' and VCM 914', are also mounted into the base plate 907'. Thus a disk drive unit is formed.

In the present invention, the HSA 904' is not limited to comprise four HGAs, for example, the amount of the HGAs may be one, two, or more than four. Accordingly, the structure of the HSA 904' maybe change in accordance with the amount of HGAs. Such changes are well known to a person ordinarily skilled in the art, a detail description of such HSA is thus omitted.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A method of connecting a head gimbal assembly with a controlling circuit thereof, comprising the steps of:

facing connecting terminals of at least one head gimbal assembly and a connecting terminal of the controlling circuit to contact with each other; and fastening said at least one head gimbal assembly with the controlling circuit to maintain a touch connection of said connecting terminals thereof.

2. The method according to claim 1, further comprising a step of disposing a conductive medium between said connecting terminals of said at least one head gimbal assembly and said connecting terminal of the controlling circuit.

3. The method according to claim 2, further comprising a step of forming a plurality of terminal pads on each of said connecting terminals of said at least one head gimbal assembly and the controlling circuit.

4. The method according to claim 3, wherein the conductive medium is disposed between the terminal pads on said connecting terminals of said at least one head gimbal assembly and the terminal pads on said connecting terminal of the controlling circuit.

5. A head stack assembly of a disk drive unit, comprising:

at least one head gimbal assembly, wherein each of the at least one head gimbal assembly has a connecting terminal; and a controlling circuit for controlling the at least one head gimbal assembly, wherein said controlling circuit has a connecting terminal;

the connecting terminals of said at least one head gimbal assembly touch connecting with the connecting terminal of said controlling circuit by fastening said at least one head gimbal assembly with said controlling circuit.

6. The head stack assembly according to claim 5, wherein a conductive medium is disposed between said connecting terminals of said at least one head gimbal assembly and the connecting terminals of said controlling circuit.

7. The head stack assembly according to claim 6, wherein said conductive medium is a metal ball.

8. The head stack assembly according to claim 7, wherein the metal ball is one of a gold ball or a solder ball.

9. The head stack assembly according to claim 6, wherein a plurality of terminal pads are formed on each of said connecting terminals of said at least one head gimbal assembly and said controlling circuit.

10. The head stack assembly according to claim 9, wherein the conductive medium is disposed between the terminal pads on said connecting terminals of said at least one head gimbal assembly and the terminal pads on said connecting terminal of said controlling circuit.

11. The head stack assembly according to claim 9, wherein the terminal pads on each pair of connecting terminals of said head gimbal assembly are symmetrically distributed along a contacting surface of the pair of connecting terminals.

12. A method of forming a head stack assembly, comprising the steps of:

forming at least one head gimbal assembly; wherein forming each of said at least one head gimbal assembly comprises:

forming a connecting terminal thereon;

forming a controlling circuit having a connecting terminal, which is used for controlling the at least one head gimbal assembly;

facing the connecting terminals of said at least one head gimbal assembly and the connecting terminal of said controlling circuit to contact with each other; and fastening said at least one head gimbal assembly with said controlling circuit to maintain a touch connection of said connecting terminals thereof.

13. The method according to claim 12, further comprising a step of disposing a conductive medium between said connecting terminals of said at least one head gimbal assembly and said controlling circuit.

14. The method according to claim 13, wherein the conductive medium is made of gold.

15. The method according to claim 13, further comprising a step of forming a plurality of terminal pads on each of said connecting terminals of said at least one head gimbal assembly and said controlling circuit.

16. The method according to claim 15, wherein the conductive medium is disposed between the terminal pads on said connecting terminals of said at least one head gimbal assembly and the terminal pads on said connecting terminal of said controlling circuit.

17. A disk drive unit, comprising:

a housing;

a disk stack comprising at least one disk;

a spindle motor being attached to the housing for rotating the disk stack; and a head stack assembly, wherein the head stack assembly comprises:

at least one head gimbal assembly, each of the at least one head gimbal assembly having a connecting terminal, a controlling circuit for controlling the at least one head gimbal assembly, said controlling circuit having a connecting terminal, and the connecting terminals of the at least one head gimbal assembly and the connecting terminal of said controlling circuit touch connecting with each other by fastening said at least one head gimbal assembly with said controlling circuit.

18. The disk drive unit according to claim 17, wherein a conductive medium is disposed between said connecting terminals of said at least one head gimbal assembly and said connecting terminal of said controlling circuit.

19. The disk drive unit according to claim 18, wherein said conductive medium is a metal ball.

* * * * *